(12) United States Patent
Bilhorn et al.

(10) Patent No.: US 7,952,073 B2
(45) Date of Patent: May 31, 2011

(54) APPARATUS AND METHOD INCLUDING A DIRECT BOMBARDMENT DETECTOR AND A SECONDARY DETECTOR FOR USE IN ELECTRON MICROSCOPY

(75) Inventors: Robert B. Bilhorn, San Diego, CA (US); Mark H. Ellisman, Solana Beach, CA (US)

(73) Assignee: Direct Electron, LP

( * ) Notice: Subject to any disclaimer, the term of this patent is extended or adjusted under 35 U.S.C. 154(b) by 463 days.

(21) Appl. No.: 12/184,995

(22) Filed: Aug. 1, 2008

(65) Prior Publication Data
US 2010/0025579 A1 Feb. 4, 2010

(51) Int. Cl.
*G21K 7/00* (2006.01)
(52) U.S. Cl. ........................................ 250/310; 250/311
(58) Field of Classification Search .................. 250/310, 250/311, 492.23, 397
See application file for complete search history.

(56) References Cited

U.S. PATENT DOCUMENTS

| | | | |
|---|---|---|---|
| 4,038,543 A | 7/1977 | Krisch et al. | |
| 4,099,055 A | 7/1978 | Todokoro | |
| 4,588,890 A * | 5/1986 | Finnes | 250/307 |
| 4,600,839 A * | 7/1986 | Ichihashi et al. | 250/310 |
| 4,847,947 A | 7/1989 | Tsong-Chi | |
| 4,941,980 A * | 7/1990 | Halavee et al. | 250/310 |
| 4,958,079 A * | 9/1990 | Gray | 250/397 |
| 4,977,321 A | 12/1990 | Mori et al. | |
| 5,006,707 A | 4/1991 | Mori et al. | |
| 5,028,778 A | 7/1991 | Ninomiya et al. | |
| 5,097,127 A | 3/1992 | Hildenbrand et al. | |
| 5,138,158 A | 8/1992 | Ninomiya et al. | |
| 5,939,720 A | 8/1999 | Todokoro | |
| 6,184,526 B1 | 2/2001 | Kohama et al. | |
| 6,498,345 B1 | 12/2002 | Weimer et al. | |
| 6,576,902 B2 * | 6/2003 | Kuwahara | 250/310 |
| 6,642,520 B2 | 11/2003 | Kimura et al. | |
| 6,677,587 B2 | 1/2004 | Kohama | |
| 6,812,462 B1 * | 11/2004 | Toth et al. | 850/1 |
| 6,825,468 B2 * | 11/2004 | Oi et al. | 250/311 |
| 6,949,745 B2 | 9/2005 | Yonezawa | |
| 7,084,406 B2 | 8/2006 | Knippelmeyer | |

(Continued)

FOREIGN PATENT DOCUMENTS

EP 1463087 A 9/2004

(Continued)

OTHER PUBLICATIONS

International Search Report for PCT/US2009/052309 for Direct Electron, LP. 7 pages.

*Primary Examiner* — Nikita Wells
*Assistant Examiner* — Johnnie L Smith
(74) *Attorney, Agent, or Firm* — Stetina Brunda Garred & Brucker

(57) ABSTRACT

An apparatus for use with an electron beam for imaging a sample. The apparatus has a down-conversion detector configured to detect an electron microscopy signal generated by the electron beam incident on the sample, a direct bombardment detector adjacent to the down-conversion detector and configured to detect the electron microscopy signal, and a mechanism selectively exposing the down-conversion detector and the direct bombardment detector to the electron microscopy signal. A method using the apparatus is also provided.

35 Claims, 2 Drawing Sheets

U.S. PATENT DOCUMENTS

| | | |
|---|---|---|
| 7,098,455 B2 | 8/2006 | Shinada et al. |
| 7,171,038 B2 * | 1/2007 | Adler et al. .................... 382/149 |
| 7,262,411 B2 * | 8/2007 | Nguyen-Huu et al. ........ 250/310 |
| 2002/0161534 A1 * | 10/2002 | Adler et al. ...................... 702/35 |
| 2003/0230714 A1 | 12/2003 | Yonezawa |
| 2004/0031936 A1 * | 2/2004 | Oi et al. ................... 250/492.23 |
| 2005/0006582 A1 | 1/2005 | Steigerwald et al. |
| 2005/0253069 A1 | 11/2005 | Zewail et al. |
| 2006/0006329 A1 | 1/2006 | Wang et al. |
| 2006/0027748 A1 | 2/2006 | Slowko |
| 2006/0169901 A1 | 8/2006 | Nguyen-Huu et al. |
| 2006/0243908 A1 | 11/2006 | Shinada et al. |
| 2007/0230768 A1 * | 10/2007 | Adler et al. .................... 382/144 |
| 2008/0067381 A1 | 3/2008 | Hiroi et al. |

FOREIGN PATENT DOCUMENTS

| | | |
|---|---|---|
| EP | 1619495 A | 1/2006 |
| WO | 2005022582 A | 3/2005 |

* cited by examiner

APPARATUS AND METHOD INCLUDING A DIRECT BOMBARDMENT DETECTOR AND A SECONDARY DETECTOR FOR USE IN ELECTRON MICROSCOPY

STATEMENT RE: FEDERALLY SPONSORED RESEARCH/DEVELOPMENT

Grant No. NIH P41RR004050 awarded by the National Institutes of Health

CROSS-REFERENCE TO RELATED APPLICATIONS

Not Applicable

BACKGROUND

The present invention relates in general to an apparatus and a method for use in electron microscopy, and more particularly, to an apparatus and a method including a direct bombardment detector and a secondary detector for use in electron microscopy.

Conventional electron microscopy use either photographic film or electronic image sensor based cameras to detect high-energy charged particles directly or indirectly with an intervening charged-particle-sensitive scintillator screen. The scintillator screen converts the impinging high-energy charged particle image into an image that can be collected on photon sensitive devices. These existing detection techniques have several drawbacks, such as limited sensitivity, limited resolution, poor usability, and time inefficiency.

Electron microscopy (EM) has been applied in various fields with the benefit of providing images at higher sensitivity, improved resolution, and a more timely fashion. One specific type of electron microscopy, that is, transmission electron microscopy (TEM) has been applied for the analysis of protein structure. X-ray protein crystallography is currently the premier method to determine the three-dimensional structures of large proteins such as DNA, RNA/protein complexes, and viruses. Cryo-electronic microscopy (cryo-EM) is emerging as a technique complementary to X-ray protein crystallography. An advantage of cryo-EM over X-ray protein crystallography is that it does not depend on the time-consuming, challenging, and in some case impossible process for growing crystals of the material to be studied. Despite the resolution limitations, cryo-EM has been used successfully in time-resolved experiments to reveal the dynamic aspects of protein interaction, something not possible in a crystalline material.

Three principal factors limit the resolution of the structures characterized by the cryo-EM. The first is the difficulties with specimen stabilization and radiation damage. The second is the difficulties of collection and processing of very large data sets required for statistical analysis. The third is the aberrations in the electron image (electron microscopy signal) formed in the microscope. The third factor has been essentially overcome recently. Instrumentation features have been developed to essentially remove chromatic aberration. The problem with the specimen stabilization and radiation damage has been partially resolved with electron microscopes that feature exceptional coherence and stability and the cryogenic techniques. The radiation damage, though mitigated, remains as a serious problem in application of electron microscope. Many materials of interest are extremely dose-sensitive. The high microscope magnification and sample dose required to acquire images of sufficient resolution and signal-to-noise ratio (SNR) often disrupt the sample. Data sets acquired with less than optimal quality are inevitably used.

The use of film to record images in electron microscopy, particularly in cryo-EM, is problematic. The film provides excellent modulation transfer and a large field of view, but requires several cumbersome post-acquisition steps. For example, the film must be processed to develop the latent image and scanned for digitization. These steps are time-consuming and require additional facilities and equipment, which results in a lack of immediacy for which digital cameras are known. The use of film can be difficult even in the pre-acquisition stage. For example, it is time-consuming to load or unload the film to and from a typical transmission microscope because it requires breaking and re-establishing microscope vacuum. Both the pre- and post-acquisition steps have the risk of fogging the film and misleading that leads to jams and further delays.

Using film for cryo-EM is particularly daunting. As estimated, one may need to collect up to 100,000 images for getting a 10 Å resolution structure of a large protein complex like the ribosome. Similarly, a 3 Å resolution structure of a structure would require up to 1 million images with the application of film, which renders the detection technique highly impractical.

Charged coupled device detectors (CCDs) have been increasingly used for detection in electron microscopy. These detectors overcome the time-consuming steps of loading, unloading, processing, and digitizing by providing a digital output directly. Commonly available CCD detectors have formats up to 4096 by 4096 pixels (4K×4K), although they fall short of delivering the full resolution anticipated by the pixel count alone. The CCD detectors and other silicon image sensors such as CMOS image sensors require the use of a fluorescent scintillation screen to convert the charged particle image to a photon image within the range where the detector efficiency is the highest. Unfortunately, with each charged-particle event, the size of a fluorescent spot produced within the scintillation screen is larger than the detector pixel size. Although scintillator material layer thickness can be reduced to reduce spot size, sensitivity is sacrificed as the number of photons produced per incident primary electron is also reduced. At 300 KeV, the full width at half maximum of the spot from a typical scintillator material is about 30 µm. However, the full width at 1% is 200 µm. The large spread of light reduces the effective resolution of typical commercial CCD cameras by at least a factor of two in each dimension rendering the resolution of a 4K CCD camera reduced to that of a 2K×2K camera only.

Fiber optic coupling between the CCD and the scintillator is the most common current design because it maximizes light collection efficiency. However, it introduces additional light scattering which further degrades the transfer of spatial information. Any material placed directly behind the scintillator layer can also produce scattering of the primary electrons. Some of the scattered electrons can re-enter the scintillator layer to produce a secondary spot of light displaced from the first that also degrades resolution. Additionally, the high-energy electrons induce damage in the scintillator and fiber optic degrading performance and ultimately requiring their replacement. All of these effects become more severe at the higher accelerating voltages desirable for cryo-EM work. In spite of these limitations, straight fiber optic bundle coupled cameras are now the most widely used detectors in electron microscopy.

To mitigate the loss in resolution resulting from the sever mismatch between the detector pixel size and the scintillator spot size, tapered fiber optics and demagnification lens systems have been developed. Tapered fiber optic coupling introduces additional large spatial distortions and non-uniformities over those present in straight fiber optic couplings. The additional distortions are difficult to correct mathematically. As a result, the application of this type of fiber optic is less widely used.

Lens systems that provide image demagnification sacrifice light gathering efficiency to preserve spatial information transfer. For sensitive samples where low electron doses are required, light gathering efficiency must be maximized by using very high numerical aperture lenses. Image de-magnifying lens transfer systems that maximize light collection efficiency are large and expensive.

A new type of detector for electron microscopy is disclosed in U.S. Pat. No. 7,262,411 entitled "Direct Collection Transmission Electron Microscopy" the complete contents of which are incorporated herein by reference. Active sensors are used in direct bombardment mode to achieve direct detection without use of a film or a scintillator screen. The new detector comprises a plurality of active pixel sensors each containing a photodiode that collects secondary electrons generated when a primary electron passes through the epitaxial silicon layer in which the p-n junction of the photodiode is formed. These detectors achieve high-speed readout, high resolution, and very high sensitivity to single primary electrons. While these devices are specifically designed to withstand the rigors of direct bombardment, like fiber optic bundles, they eventually suffer damages and/or degradation.

Accordingly, there exists a need in the art for an improved apparatus and/or method for imaging a sample in electron microscopy.

BRIEF SUMMARY

An apparatus for use with an electron beam for imaging a sample is provided. The apparatus includes a down-conversion detector configured to detect an electron microscopy signal generated by the electron beam incident on the sample. The apparatus further includes a direct bombardment detector adjacent to the down-conversion detector and configured to detect the electron microscopy signal. The apparatus further includes a mechanism selectively exposing the down-conversion detector and the direct bombardment detector to the electron microscopy signal.

Preferably but optionally, the down-conversion detector comprises a scintillator, a plurality of sensor pixels, and an optical fiber plate optically coupling the scintillator and the sensor pixels. The scintillator may be a YAG scintillator or a polycrystalline scintillator, for examples, and a charge-coupled device (CCD) or a CMOS image sensor can be used for the sensor pixels. The down-conversion detector may be configured to obtain the focus information of the electron microscopy signal and to identify of a region of interest of the electron microscopy signal before commencing detection by the direct bombardment detector. The direct bombardment detector may comprise a plurality of active pixel sensors, such that primary electrons carrying the image of the sample can be detected without using any intervening device such as the scintillator or a film. The mechanism may comprise a shutter positionable in a propagation path of the electron microscopy signal upstream to the direct bombardment detector. When the detection result of the down-conversion shows that the electron microscopy signal is beyond the acceptable detection range of the direct bombardment detector, the electron beam, and consequently, the electron microscopy, can be adjusted before impinging on the director bombardment detector. The mechanism may also be a steering device to steer the electron microscopy signal between the down-conversion detector and the direct bombardment detector.

In application, the down-conversion detector and the direct bombardment detector may be integrated into a single camera. The apparatus may use a Faraday plate to measure total cumulative dose and instantaneous dose of the electron microscopy signal to prevent the over-dosed electron microscopy signal from damaging the direct bombardment detector.

According to another aspect of the invention, a method of producing an image of a sample using an electron beam is also provided. The electron beam is applied to the sample for generating an electron microscopy signal. The electron microscopy signal is detected by a down-conversion detector to obtain a detection result. At least one detection parameter to be used with the direct bombardment detector can be determined based on the detection result of the down-conversion detector. The electron microscopy signal is then detected by a direct bombardment detector using the detection parameter. The method can be applied to image a biological matter. The detection parameter may include focusing information of the electron microscopy signal and a region of interest of the sample. The method may further comprise a step of steering the electron microscopy signal towards the direct bombardment detector for detecting the electron microscopy signal by the direct bombardment detector. The direct bombardment detector is preferably blocked from exposure of the electron microscopy signal before the detection parameter is determined. Both of the down-conversion detector and the direct bombardment detector can be cooled down to below ambient temperature.

In an embodiment of the invention, a direct bombardment detector and a beam current measuring device are integrated in a camera. The direct bombardment detector is configured to detect an electron microscopy signal generated by the electron beam incident on the sample. The beam current measuring device is located in a propagation path of the electron microscopy signal upstream to the direct bombardment detector for measuring the current of the electron microscopy signal. The apparatus further comprises a mechanism configured to selectively prevent the electron microscopy signal from being incident on the direct bombardment detector. The beam current measuring device may include a Faraday plate operative to measure a dose of the electron microscopy signal. The mechanism may include a shutter positionable in the propagation path of the electron microscopy signal upstream to the direct bombardment detector.

According to another aspect of the present invention, there is provided a method of imaging a sample in electron microscopy including the following steps. An electron beam is applied to the sample for generating an electron microscopy signal. A beam current detector is used to detect the current and dose of the electron microscopy signal. The detection result of the beam current detector determines at least one detection parameter of the direct bombardment detector to detect the electron microscopy signal. The method can be applied for imaging a biological matter. The beam current detector is preferably a Faraday plate operative to measure the current of the electron microscopy signal and determine the dose of the electron microscopy signal based on the measured current. Both the instantaneous dose and the total cumulative dose applied to the direct bombardment detector can be determined. When the dose is beyond the range acceptable to the direct bombardment detector, the dose of the electron beam is adjusted to an acceptable range such that the direct bombardment will not be damaged. A moveable shutter may be positioned in the propagation path of the electron microscopy signal to block the electron microscopy signal from the direct bombardment detector.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
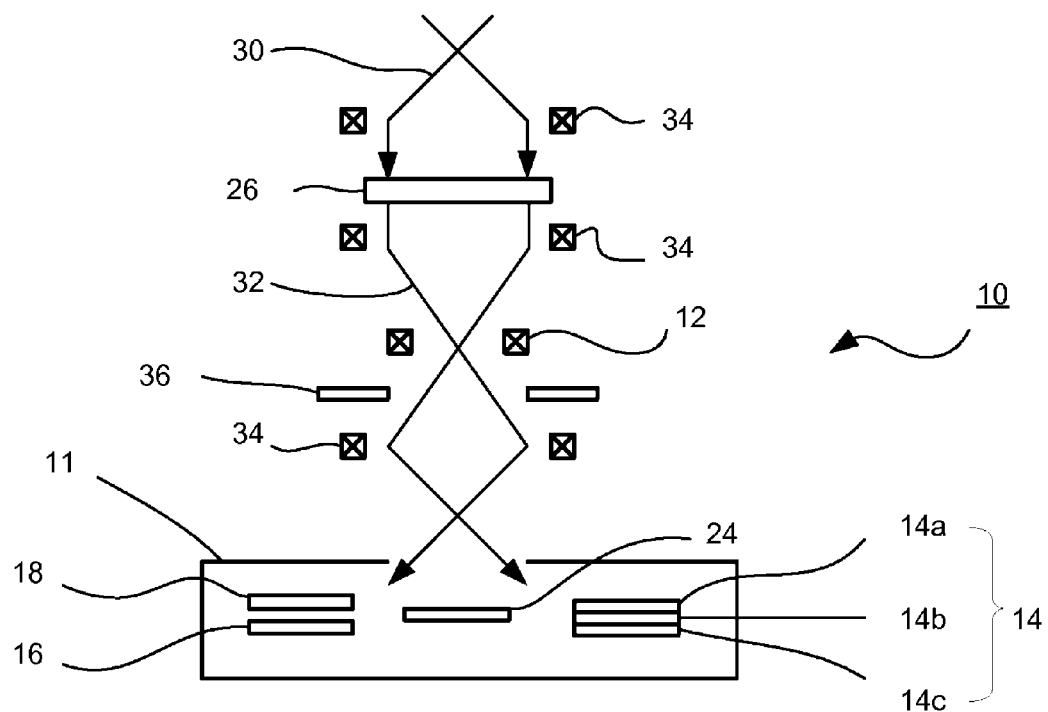
FIG. 1 is a schematic drawing of an apparatus for use in electron microscopy that includes a down-conversion detector and a direct bombardment detector.

Direct bombardment detectors in microscopy offer a number of significant advantages over traditional means of detection and imaging. By direct bombardment detection, primary image-forming electrons may be detected by impinging these electrons directly on a pixelated detector without the use any intervening energy down-conversion techniques. The impinging electrons deposit some of their energy in the detector in the form of a cloud of secondary electrons. The cloud of secondary electrons is then detected by techniques commonly done in optical image sensors such as CCDs or CMOS image sensors. The advantages of direct bombardment detection may include high sensitivity, for example, detection of individual primary electron with a signal-to-noise ratio (SNR) over 10, and improved spatial resolution. Direct bombardment detection also offers relatively increased speed of image data acquisition through high operation rates and large-scale integration of read-out and digitization functions.

The advantages described above may be realized in a number of ways in electron microscopy. For example, the very high sensitivity and high spatial resolution are of particular benefit for determination of structure and conformation of highly sensitive sample specimens such as biological material. The benefit of high sensitivity translates into relatively lower electron dose on the sample for a given SNR in the image. The higher spatial resolution can also be used to reduce sample dose. With a direct detector, lower microscope magnification is required to achieve the same resolution as a detector with poorer spatial resolution. Lower magnification operating points tend to reduce dose on the sample and confer additional advantages such as improved stability.

Direct bombardment detection may further offer advantages beyond dose reduction for use with image beam damage sensitive and other unstable materials in electron microscopy. These advantages arise from the method of operation of a direct bombardment detector. Unlike traditional detectors such as CCDs and CMOS image sensors that accumulate photo-generated charges in their pixels prior to the read-out of an image frame, direct bombardment detectors tend to read out much faster and more frequently. This is possible because of their high single primary electron sensitivity which provides high readout speed without the penalty of introducing unacceptable levels of readout noise in each frame.

In the normal course of producing an image of a beam damage susceptible sample one hundred direct bombardment images might be acquired as compared with a single image for a typical integrating detector. In either case, total dose on the sample is the same. The images acquired by direct bombardment detection are examined and processed independently prior to combination into a final single image. Typical processing steps might include correction for specimen image drift using a technique such as correlation analysis, and examination for the onset of beam damage in the specimen. Individual frames or groups of frames are corrected for image drift and only frames collected prior to the onset of sample degradation are used. This results in a composite image that has higher spatial resolution than what would be possible with a single acquisition.

The problem of specimen image drift cannot be avoided in the same way with a CCD or CMOS image sensor by increasing the dose rate and decreasing the exposure time while holding the total dose constant. This is because sample damage is both dose and dose rate dependent. That is, 10 electrons per square angstrom on the sample will make different degrees of damage depending on whether the dose rate is 1 $e^-/Å^2 \cdot sec$ or 10 $e^-/Å^2 \cdot sec$.

Notwithstanding the above advantages, direct bombardment detectors suffer from degradation in performance over time due to direct exposure to high-energy primary electron emissions. High-energy electrons and high-energy X-rays produced in electron microscopy can cause dislocations in the crystalline lattice structure of the materials used to form the direct bombardment detector. These dislocations results in several effects, including increasing the rate of thermally generated charge in the structure. The thermally generated charge, also referred as dark current, result from electrons in the device (secondary electrons) randomly acquiring enough energy to cross the valence-band to conduction-band gap. Electrons that cross the band gap are indistinguishable from the signal electrons that carry the desired image information. Damage to the lattice structure by primary electrons or X-rays introduces new energy states within the band-gap region, which reduces the barrier for the thermally generated charge to cross over. As a result, more dark current is generated. Although dark current rate remains relatively constant when the temperature is held constant and its contribution to signal can be subtracted, shot noise associated with the dark current cannot be subtracted. The shot noise contributes noise to the final image. As the dark current becomes more severe, an appreciable fraction of the detector dynamic range may start to be consumed.

FIG. 1 shows an apparatus 11 which provides the advantages as described above while mitigating the above drawbacks of the direct bombardment detector. As shown, the apparatus integrates a secondary detector 14 in the form of down-conversion detector with a direct bombardment detector 16 in a single camera 11. In this embodiment, the down-conversion detector 14 is used as a survey detector to perform detection during a sample-setup stage. The activation of the direct bombardment detector 16 may be avoided until a stage for final data collection. When an electron beam 30 impinges on a sample or a specimen 26, an electron image, that is, an electron microscopy signal 32 carrying the image of the specimen 26, is generated and incident on the camera 11. During a sample-setup stage, the electron microscopy signal is steered towards the down-conversion detector 14 allowing it to perform detection of the electron microscopy signal and to generate an image. The characteristics of the image are referred as a detection result and based on which, detection parameters such as focus of the specimen 26 and the electron microscopy signal, identification of region of interest of the specimen 26, and dose of the electron beam 30 can be determined to establish desired operating condition for the direct bombardment detector 16.

As shown in FIG. 1, electron optics 34 and an aperture 36 may be used along the propagation path of the electron beam 30 and the electron microscopy signal 32. A steering device 12 may be used to steer the electron microscopy signal 32 between the down-conversion detector 14 and the direct bombardment detector. Beam deflection or image shift coils can be used as the steering device 12 to steer the electron microscopy signal 32 in a very rapid and precise way. The beam deflection coils avoids vibrations or other instabilities associated with mechanical movement. Although the beam deflection coils are preferably used as the steering device 12, other steering mechanism operative to achieve a steering effect may also be employed.

Preferably, the down-conversion detector 14 typically includes a scintillator 14a and a CCD detector or CMOS image sensor 14c optically coupled with each other by an optical fiber plate 14b. Although the down-conversion detector 14 does not have spatial resolution as good as that of the direct bombardment detector 16, accurate focusing can be achieved by the down-conversion detector 14 using interpolation techniques. Two-dimensional fast Fourier transform (FFT) may be performed on the detection result obtained by the down-conversion detector 14 and followed by steps of computing the power in the high-frequency portion of the spectrum and adjusting the focus of the electron microscopy signal. Since the focus changes shift the electron microscopy signal, image shift coils can be used to re-center the electron microscopy signal to obtain a new detection result. An FFT is performed on the new detection result and the same process is repeated a number of times to obtain a plot of power in high frequency portion of the spectrum versus focus adjustment. Thereby, the electron microscopy signal can be focused and the position of the electron microscopy signal for exposure can be adjusted as desired.

In addition to focusing the electron microscopy signal, the detection result of the down-conversion detector 14 can also be used to determine the region of interest of the electron microscopy signal. In one embodiment, the specimen 26 may be supported by a porous carbon film which contains a regular array of holes in a thin film. The specimen 26 such as virus particles is suspended in an aqueous solution. The film may be immersed into the solution and withdrawn and rapidly frozen to form amorphous ice by plunging the film into a cryogenic liquid. The particles of interest are suspended in the meniscus of liquid formed in the holes. The specimen 26 (which at this stage is frozen) may be disposed in a microscope vacuum and kept at cryogenic temperature during imaging. A sample which is suitable for imaging should not contain crystalline ice and should contain a suitable number of particles. Therefore, the survey detector, that is, the down-conversion detector 14 is used to determine the location of the holes in the film that contain sufficiently amount of particles in amorphous ice state. To identify the region of interest, the specimen 26 is brought into focus with a magnification that allows a number of holes in the field of view of the down-conversion detector 14 at a time and lowest possible dose. The identified region of interest is then catalogued for subsequent detection by the direct bombardment detector 16. To image the identified region of interest, the coordinates of one hole of the identified region of interest is shifted to allow the electron microscopy signal incident towards the direct bombardment detector 16. The magnification is increased so that the hole or a part of the hole fills the field of view of the direct bombardment detector 16. The electron beam 30 is adjusted to a level suitable for the specimen 26, for example, a total dose of a few electrons per square angstrom in case of sensitive biological materials. The focus may be adjusted based on the depth of the hole and multiple images acquired in order to sample many particles in the ice. The above procedures may be repeated for all catalogued regions of interest. Many tens of thousands of images of particles captured at random particle orientations may be used to reconstruct a three-dimensional structure of the particles.

It is understood that microscope images slowly drift across the detector plane even under ideal circumstances. For high precision work, the drift between successively acquired images is corrected before the images are added together. The drift is generally in a single direction, yet careful work requires more sophisticated correction than a simple linear translation. A common method of image drift correction is achieved by computing the cross-correlation between successive images and then iteratively modifying one image to maximize the correlation coefficient before adding these images together. In practice, image drift correction may be performed every one to five seconds. Under signal-limited conditions, exposure time is maximized and images representing single exposures are co-added following drift correction. Under high-signal conditions, shorter exposure times may be used to prevent detector saturation.

Figure 2:
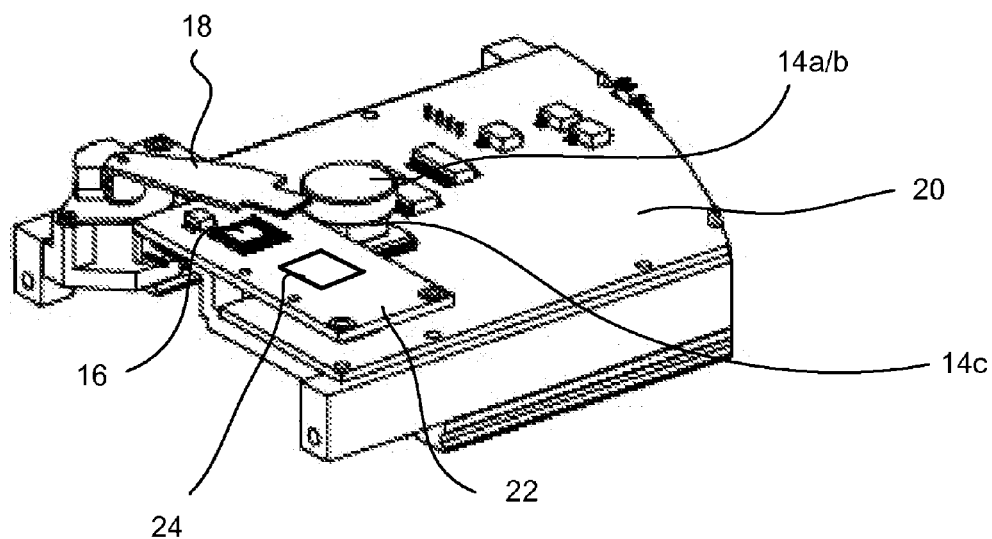
FIG. 2 depicts a perspective view of the integration between the down-conversion detector and direct bombardment detector as depicted in FIG. 1.
Figure 3:
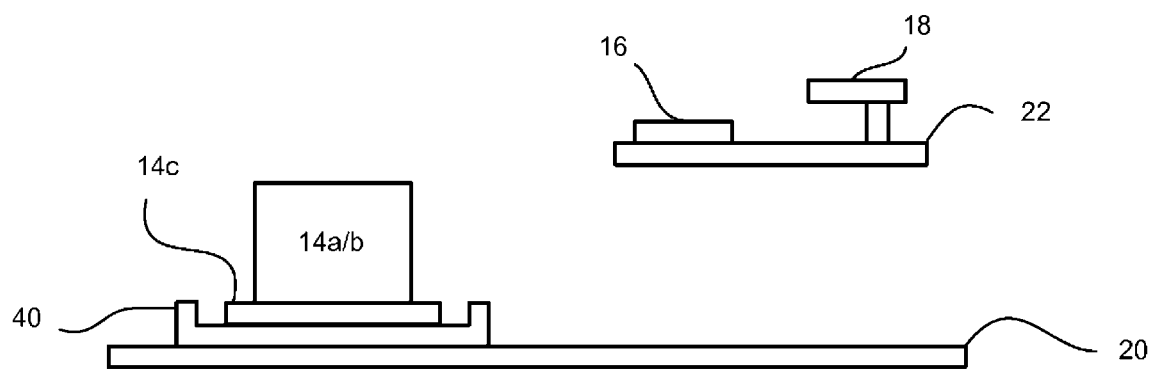
FIG. 3 depicts the relative position of the down-conversion detector and the direct bombardment detector as depicted in FIG. 1.

After the detection parameters are determined, the steering device 12 may be operated to steer the electron microscopy signal 32 from the down-conversion detector 14 towards the direct bombardment detector 16. It allows the direct bombardment detector 16 to directly detect primary electrons that form the electron microscopy signal 32 and to provide an image of the specimen 26 with relatively higher sensitivity and resolution. As shown in FIGS. 2 and 3, the direct bombardment detector 16 and the shutter 18 are disposed on a mounting surface 22 and the elements of the down-conversion detector 14, including the scintillator 14a, the optical fiber plate 14b, and the imager 14c are assembled in a single package 40 supported by a mounting surface 20. The mounting surfaces 20 and 22 are so configured that the direct bombardment detector 16 is adjacent to the down-conversion detector 14 and their positions can be easily established and calibrated.

To protect the direct bombardment detector 16 from undesired exposure of the electron microscopy signal 32, a moveable shutter 18 may be installed to selectively block the electron microscopy signal 32 from being incident on the direct bombardment detector 16. This prevents the director bombardment detector 16 from being damaged by over-dosed and frequent radiation of the electron microscopy signal 32. As shown in FIG. 2, the shutter 18 is moveable about a pivot point between a position to completely block the electron microscopy signal 32 from the direct bombardment detector 16 and a position where the direct bombardment detector 16 is completely exposed to the electron microscopy signal 32. To ensure that dose of the electron microscopy signal 34b is within acceptable detection range, a Faraday plate 24 may also be used in association with the shutter 18 and/or the steering device 16. The Faraday plate 24 is operative to measure the current of the electron microscopy signal 32 when the direct bombardment detector 16 is or is not exposed to the electron microscopy signal 32. As shown in FIGS. 1-3, the Faraday plate 24 is located adjacent to the direct bombardment detector 16. When the current is too high, the dose of the electron microscopy signal 32 beyond the acceptable range can be adjusted down to an acceptable range before the electron microscopy signal 32 is steered towards the direct bombardment detector 16 or the shutter 18 is removed away from the blocking position. The Faraday plate 24 may also serve to monitor total cumulative dose of the electron microscopy signal 32 incident on the direct bombardment detector 16. A microprocessor may be used to keep track of the current measured by the Faraday plate 24 and the position of the shutter 18 at all time to accurately compute the cumulative dose on the direct bombardment detector 16. The microprocessor may also be used to check the current of the Faraday plate 24 before moving the shutter 18 away from the direct bombardment detector 16 to ensure that the dose of the electron microscopy signal 32 incident on the direct bombardment detector 16 is always within a reasonable or acceptable range.

Although the apparatus as shown in FIGS. 1-3 integrates the beam current measuring device, that is, the Faraday plate 24, the down-conversion detector, 14 and the direct bombardment detector 18 into the same camera 11. It is appreciated that the present invention is not limited to this specific configuration. Other arrangements, for example, an apparatus includes a single camera that integrates only the down-conversion converter 14 and the direct bombardment detector 16, a single camera that integrates only the direct bombardment detector 16 and the shutter 18, or a single camera that integrates only the direct bombardment detector 16 and the Faraday plate 24, are also within the scope of the present invention.

Figure 4:
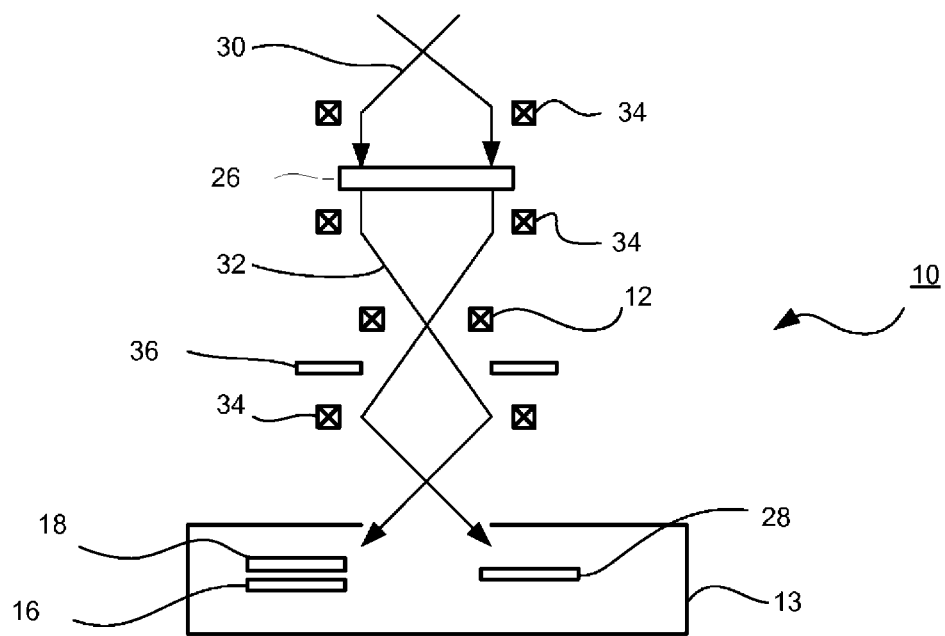
FIG. 4 depicts an apparatus including a direct bombardment detector and a beam current measuring detector for use in electron microscopy according to another aspect of the invention.

FIG. 4 depicts another embodiment of the present invention. As depicted in FIG. 4, the apparatus for use with an electron beam to image a specimen includes a secondary detector 28 in the form of a beam current measuring device adjacent to a direct bombardment detector 16. The apparatus also includes the moveable shutter 18 in order to selectively protect the direct bombardment detector 16 from being exposed to the electron microscopy signal 32. Instead of focusing the electron microscopy signal 32 and identifying the region of interest of the specimen 26, the detection beam current devices measures current of the electron microscopy signal 32, such that the dose of which to be applied to the direct bombardment detector 16 can be determined. Preferably, the secondary detector 28 is also operative to measure the dose of the electron microscopy signal 32 actually incident on the direct bombardment detector 16, such that the total cumulative dose can be monitored and controlled. Preferably, the direct bombardment detector 16, the beam current measuring device 28, and the shutter 18 are integrated in the camera 13. The apparatus may further comprise the steering device 12, the electron optics 34 and 36.

Maintenance of the direct bombardment detector 16 may include annealing the detector at high temperature to "heal" some of damage caused by incidence of high-energy electrons. Annealing works only to a certain degree and the direct bombardment detector 16 has to be replaced eventually. Therefore, the integration of a current measuring device and/or a down-conversion detector in combination with the beam blocking device ultimately prolong the lifetime of the direct bombardment detector 16 which is able to provide an image with high sensitivity and resolution in electron microscopy.

The above description is given by way of example, and not limitation. Given the above disclosure, one skilled in the art could devise variations that are within the scope and spirit of the invention disclosed herein. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. An apparatus for use with an electron beam for imaging a sample, the apparatus comprising:
   a down-conversion detector configured to detect an electron microscopy signal generated by the electron beam incident on the sample;
   a direct bombardment detector adjacent to the down-conversion detector and configured to detect the electron microscopy signal; and
   a mechanism selectively exposing the direct bombardment detector to the electron microscopy signal.

2. The apparatus of claim 1, wherein the down-conversion detector comprises a scintillator.

3. The apparatus of claim 2, wherein the scintillator includes a YAG scintillator.

4. The apparatus of claim 2, wherein the scintillator includes a polycrystalline scintillator.

5. The apparatus of claim 1, wherein the down-conversion detector comprises a plurality of pixels.

6. The apparatus of claim 1, wherein the down-conversion detector includes a charge-coupled device (CCD).

7. The apparatus of claim 1, wherein the down-conversion detector includes a CMOS image sensor.

8. The apparatus of claim 1, wherein the down-conversion detector is configured to focus the electron microscopy signal.

9. The apparatus of claim 1, wherein the down-conversion detector is configured to identify of a region of interest of the sample.

10. The apparatus of claim 1, wherein the direct bombardment detector comprises a plurality of active pixel sensors.

11. The apparatus of claim 1, wherein the mechanism comprises a shutter positionable in a propagation path of the electron microscopy signal upstream to the direct bombardment detector.

12. The apparatus of claim 1, wherein the mechanism comprises a steering device to steer the electron microscopy signal between the down-conversion detector and the direct bombardment detector.

13. The apparatus of claim 1, wherein the down-conversion detector and the direct bombardment detector are integrated into a single camera.

14. The apparatus of claim 1, further comprising an optical fiber plate coupled to the down-conversion detector.

15. The apparatus of claim 1, further comprising a Faraday plate configured to measure total cumulative dose of the electron microscopy signal.

16. The apparatus of claim 1, further comprising a Faraday plate configured to measure instantaneous dose of the electron microscopy signal.

17. A apparatus for use with an electron beam for imaging a sample, the apparatus comprising:
   a down-conversion detector configured to detect an electron microscopy signal generated by the electron beam incident on the sample;
   a direct bombardment detector adjacent to the down-conversion detector and configured to detect the electron microscopy signal; and
   wherein the down-conversion detector and the direct bombardment detector are integrated into a single camera.

18. A method of producing an image of a sample using an electron beam, the method comprising the steps of:
   a) applying the electron beam to the sample for generating an electron microscopy signal;

b) detecting the electron microscopy signal by a down-conversion detector to obtain a detection result;

c) determining at least one detection parameter based on the detection result of the down-conversion detector; and d) detecting the electron microscopy signal by a direct bombardment detector using the detection parameter.

19. The method of claim 18, wherein the sample includes a biological matter.

20. The method of claim 18, wherein the detection parameter includes focusing information of the electron microscopy signal.

21. The method of claim 18, wherein the detection parameter includes a region of interest of the sample.

22. The method of claim 18, further comprising a step of steering the electron microscopy signal towards the direct bombardment detector for detecting the electron microscopy signal by the direct bombardment detector.

23. The method of claim 18, further comprising a step of blocking the direct bombardment detector from exposure of the electron microscopy signal before the detection parameter is determined.

24. The method of claim 18, further comprising a step of cooling the down-conversion detector to below ambient temperature.

25. The method of claim 18, further comprising a step of cooling the direct bombardment detector to below ambient temperature.

26. An apparatus for use with an electron beam for imaging a sample, the apparatus comprising:

a direct bombardment detector configured to detect an electron microscopy signal generated by the electron beam incident on the sample;

a beam current measuring device to be located adjacent to the direct bombardment detector; and a mechanism configured to selectively prevent the electron microscopy signal from being incident on the direct bombardment detector.

27. The apparatus of claim 26, wherein the beam current measuring device includes a Faraday plate.

28. The apparatus of claim 26, wherein the mechanism includes a shutter positionable in the propagation path of the electron microscopy signal upstream to the direct bombardment detector.

29. A method of producing an image of a sample using an electron beam and a direct bombardment detector, the method comprising the step of:

a) applying the electron beam to the sample for generating an electron microscopy signal;

b) detecting the electron microscopy signal by a beam current detector to obtain a detection result;

c) determining at least one detection parameter based on the detection result of the beam current detector; and d) detecting the electron microscopy signal by the direct bombardment detector using the detection parameter.

30. The method of claim 29, wherein the sample includes a biological matter.

31. The method of claim 29, wherein the detection parameter includes a dose of the electron microscopy signal.

32. The method of claim 31, wherein the dose includes an instantaneous dose applied to the direct bombardment detector.

33. The method of claim 31, wherein the dose includes a total cumulative dose applied to the direct bombardment detector.

34. The method of claim 29, further comprising a step of setting a dose of the electron beam applied to the sample.

35. The method of claim 29, further comprising a step of positioning a moveable shutter to selectively block the electron microscopy signal from the direct bombardment detector based on the detection parameter.

* * * * *